US008595268B2

(12) United States Patent
Shoolman et al.

(10) Patent No.: US 8,595,268 B2
(45) Date of Patent: Nov. 26, 2013

(54) SYSTEM, METHODS, AND MEDIA FOR COMPRESSING NON-RELATIONAL DATABASE OBJECTS

(75) Inventors: Yiftach Shoolman, Modi'in (IL); Ofer Bengal, Hod Hasharon (IL)

(73) Assignee: Garantia Data Ltd., Hod Hasharon (IL)

( * ) Notice: Subject to any disclaimer, the term of this patent is extended or adjusted under 35 U.S.C. 154(b) by 237 days.

(21) Appl. No.: 13/247,263

(22) Filed: Sep. 28, 2011

(65) Prior Publication Data
US 2012/0078978 A1 Mar. 29, 2012

Related U.S. Application Data

(60) Provisional application No. 61/387,255, filed on Sep. 28, 2010, provisional application No. 61/427,492, filed on Dec. 28, 2010.

(51) Int. Cl.
*G06F 7/00* (2006.01)
*G06F 17/30* (2006.01)

(52) U.S. Cl.
USPC .......................................... 707/803; 707/793

(58) Field of Classification Search
None
See application file for complete search history.

(56) References Cited

U.S. PATENT DOCUMENTS

2010/0185593 A1* 7/2010 Wong et al. .................. 707/684

OTHER PUBLICATIONS

DeCandia et al. "Dynamo: Amazon's Higly Available Key-Value Store" SOSP 2007 Stevenson, WA USA.*

* cited by examiner

*Primary Examiner* — Pierre Vital
*Assistant Examiner* — Berhanu Mitiku
(74) *Attorney, Agent, or Firm* — Byrne Poh LLP

(57) ABSTRACT

Method, media, and systems for compressing objects, comprising: receiving a request to write a first object including a first key and a first value, wherein the first object is of a given type; receiving a request to write a second object including a second key and a second value, wherein the second object is of the given type; classifying the first object to a compression dictionary according to at least one rule based on a value of the first object and/or the key of the first object; classifying the second object to the compression dictionary according to at least one rule based on a value of the second object and/or the key of the second object; and compressing the first object and the second object based on the compression dictionary.

15 Claims, 10 Drawing Sheets

| Class Type | Header Rules | Body Rules | Action |
|---|---|---|---|
| HTML | First Bytes are equal to "<!DOCTYPE HTML ..." | None | Compress using the default dictionary |
| XML | First Bytes are equal to "<?xml version" | The pattern "type=session" appears in the first 20 bytes of the body | Compress using the session dictionary |
| JPEG (*.jpg) | First Bytes are equal to 0xFF08 | | Skip compression |
| TXT | Any combination of bytes | The following patterns appears in the first 100 bytes of the body: "user" and "address" and "email" | Compress using the profile dictionary |

SYSTEM, METHODS, AND MEDIA FOR COMPRESSING NON-RELATIONAL DATABASE OBJECTS

CROSS REFERENCE TO RELATED APPLICATIONS

This application claims the benefit of U.S. Provisional Patent Applications Nos. 61/387,255, filed Sep. 28, 2010, and 61/427,492, filed Dec. 28, 2010, each of which is hereby incorporated by reference herein in its entirety.

BACKGROUND

Many Web 2.0 and Software as a Service (SaaS) applications rely heavily on user-created content. This reliance drives the need for (a) efficient and reliable scaling technologies for supporting rapid data growth; and (b) better storage and retrieval technology. Much of this user-created content only requires a primary key for store and retrieve commands rather than complex querying and management functionality offered by traditional Relational Database Management Systems (RDBMS's). The excess RDBMS functionality involves expensive hardware and highly skilled personnel, typically making it unsuitable for these types of applications. In-addition, RDBMS replication capabilities are limited and typically prefer consistency over performance and availability. Despite many developments in recent years, scaling-out a relational database is still very complex.

During recent years NoSQL (Not Only SQL) database management systems (which are also referred to as non-relational databases or unstructured databases) have emerged in-order to solve these RDBMS deficiencies. NoSQL is a broad class of database management systems that can differ from classic RDBMS in some significant ways: (1) there are no inherent relations between stored objects; (2) the data stores may not require fixed table schemas; and (3) NoSQL avoids join operations and typically scales horizontally.

In-memory non-relational databases are subset of NoSQL databases, and are designed in a way that all of (or a major part of) the users' dataset is stored in RAM Memory. In-memory non-relational databases are usually in two to three orders of magnitude faster (in terms of throughput and latency) than RDBMS's and an order of magnitude faster than other NoSQL databases.

Among the in-memory non-relational databases, the open source Memcached was first to emerge intending to solve many of the RDBMS issues of read operations, by adding to RDBMS a simple distributed key-value caching system. However, Memcached does not include a data-management layer, and therefore provides no support for high-availability and data-persistence. In addition, during scaling events, Memcached loses all, or significant part of its data.

Redis, an emerging open-source in-memory non-relational database improves Memcached's offering by supporting write operations, persistence storage and high-availability, using a data management-layer for the stored objects. But Redis is built over a single master multi-slave architecture, and therefore suffers from master scaling problems.

Furthermore, due to the relatively high price of RAM resources (as of July 2011, RAM prices are ~300 times higher than HHD (Hard Disk Drive) and ~30 times higher than SSD (Solid State Disk)), in-memory non-relational databases are very expensive.

Accordingly, there is a need for improved mechanisms for providing in-memory non-relational databases.

SUMMARY

Systems, methods, and media for compressing non-relational database objects are provided. In some embodiments, methods for compressing objects are provided, the methods comprising: receiving a request to write a first object including a first key and a first value, wherein the first object is of a given type; receiving a request to write a second object including a second key and a second value, wherein the second object is of the given type; classifying the first object to a compression dictionary according to at least one rule based on a value of the first object and/or the key of the first object; classifying the second object to the compression dictionary according to at least one rule based on a value of the second object and/or the key of the second object; and compressing the first object and the second object based on the compression dictionary.

In some embodiments, non-transitory computer-readable media containing computer-executable instructions that, when executed by a processor, cause the processor to perform a method for compressing objects are provided, the method comprising: receiving a request to write a first object including a first key and a first value, wherein the first object is of a given type; receiving a request to write a second object including a second key and a second value, wherein the second object is of the given type; classifying the first object to a compression dictionary according to at least one rule based on a value of the first object and/or the key of the first object; classifying the second object to the compression dictionary according to at least one rule based on a value of the second object and/or the key of the second object; and compressing the first object and the second object based on the compression dictionary.

In some embodiments, systems for compressing objects are provided, the systems comprising: at least one hardware processor that: receives a request to write a first object including a first key and a first value, wherein the first object is of a given type; receives a request to write a second object including a second key and a second value, wherein the second object is of the given type; classifies the first object to a compression dictionary according to at least one rule based on a value of the first object and/or the key of the first object; classifies the second object to the compression dictionary according to at least one rule based on a value of the second object and/or the key of the second object; and compresses the first object and the second object based on the compression dictionary.

BRIEF DESCRIPTION OF THE DRAWINGS

FIG. 7 is a diagram of a classification rules in accordance with some embodiments.

DETAILED DESCRIPTION

Systems, methods, and media for compressing objects are provided.

Figure 1:
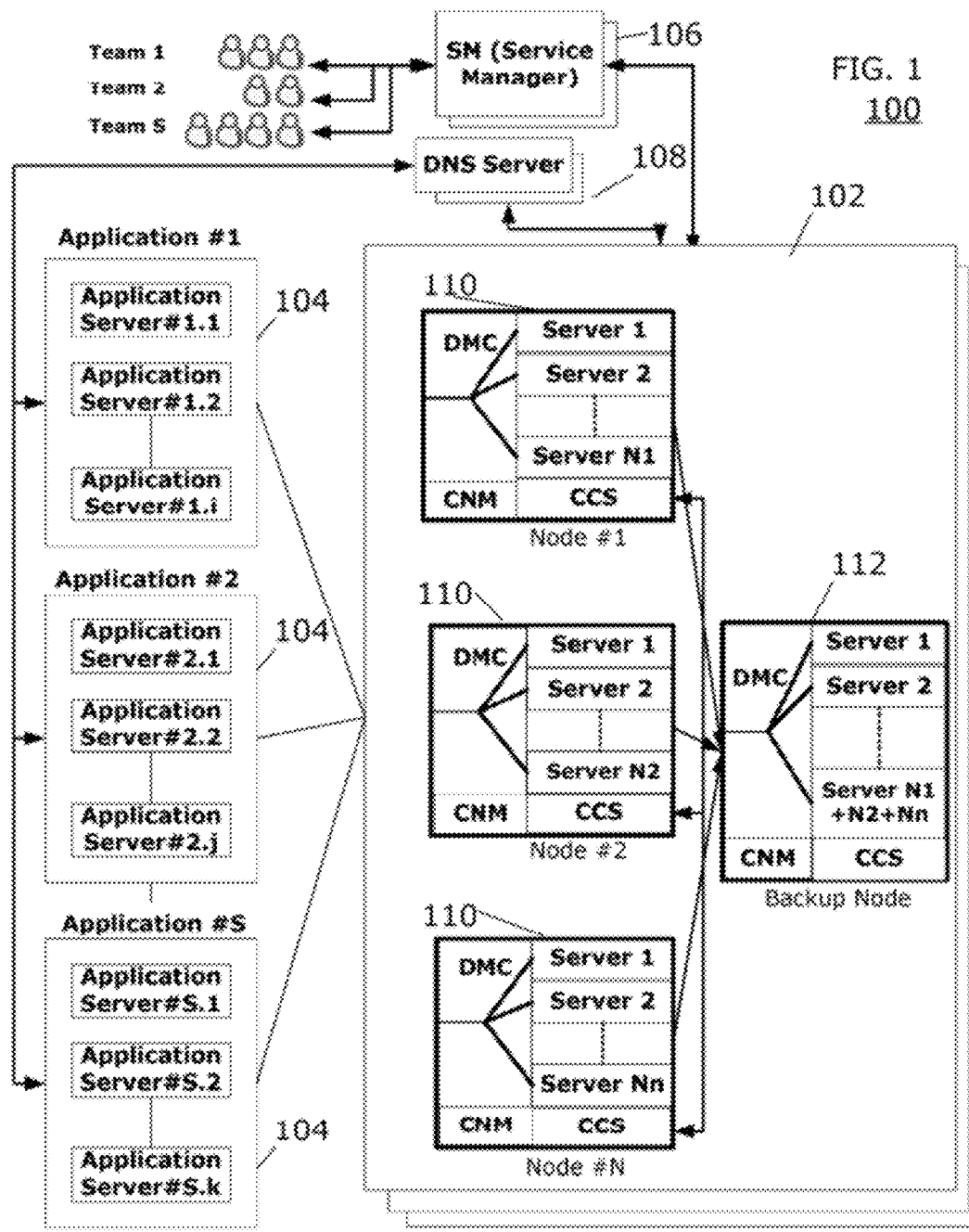
FIG. 1 is a diagram of a cluster architecture in accordance with some embodiments.

In accordance with some embodiments, an in-memory non-relational database can be implemented as a system 100 as illustrated in FIG. 1. As shown, system 100 can include one or more clusters 102, one or more applications 104, one or more service managers 106, and one or more domain name servers 108. Clusters 102 can be one or more clusters of nodes 110 for providing in-memory data storage as well as related functionality as described further below. Applications 104 can be one or more applications that use data and related information stored in nodes 102. Service manager (SM) 106 can be an entity that manages the user interaction with the system, as well as maps user configuration to cluster resources. The SM can be designed to support single- and multi-tenancy modes of operation, and can allow the system to be supplied as a service. The SM can also communicate with a cluster node manager of a node (described below) for aggregating service statistics and alarms. When deployed as a service, the SM can also be responsible for usage reports and billing. DNS 108 can provide a mechanism for domain name server functions as known in the art.

Figure 2:
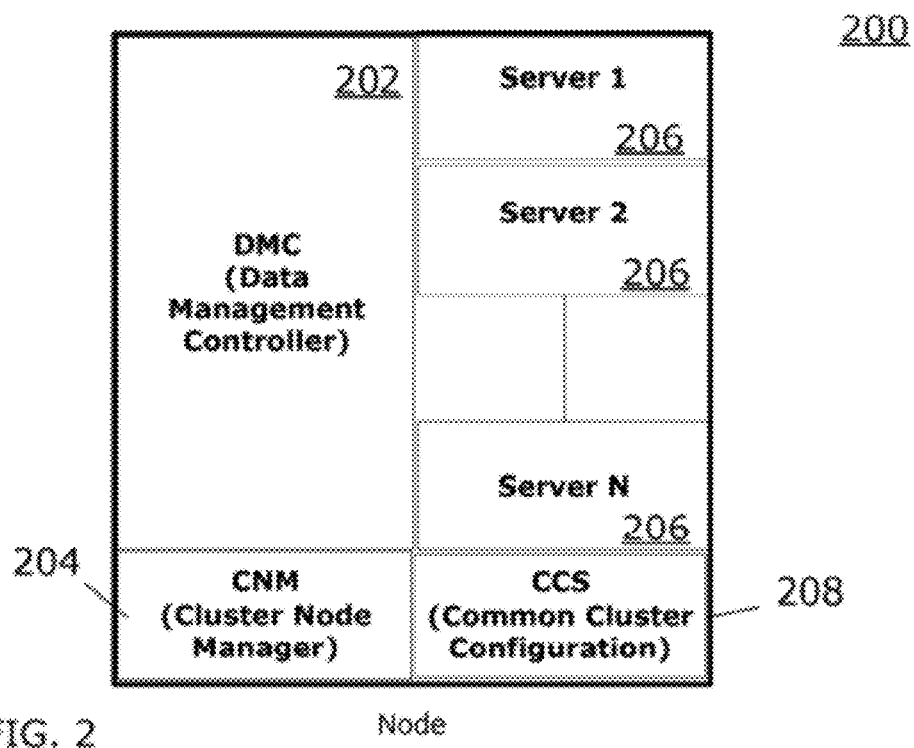
FIG. 2 is a diagram of a node architecture in accordance with some embodiments.

Turning to FIG. 2, an example of a node 200 that can be used as a node 110 in a cluster 102 in accordance with some embodiments is illustrated. As shown, node 200 can include a data management controller (DMC) 202, a cluster node manager (CNM) 204, zero or more servers 206, and common cluster storage 208. As described more fully below, in some embodiments, server(s) 206 can be used to provide in-memory non-relational database functionality and any other suitable server process(es). In some embodiments, the server(s) can be based on the open-source Redis server with enhanced functionality. In some embodiments, the server(s) can represent one of the following options: (1) a Memcached Bucket; (2) a partition of a Memcached Bucket; (3) a Redis database (DB); or (4) a partition of a Redis DB.

In accordance with some embodiments, data management controller 202 can be used to manage the data flow of node 200, to manage the data flow between node 200 and one or more other nodes in the same cluster, and to manage the data flow between node 200 and one or more nodes in another cluster.

DMC 202 can also be used to perform client authentication in some embodiments. Any suitable one or more client authentication mechanisms can be used. For example, Simple Authentication and Security Layer (SASL) authentication, password authentication, source IP authentication, Amazon Web Service Security Group, and/or any other suitable authentication mechanisms can be used in some embodiments.

Figure 3:
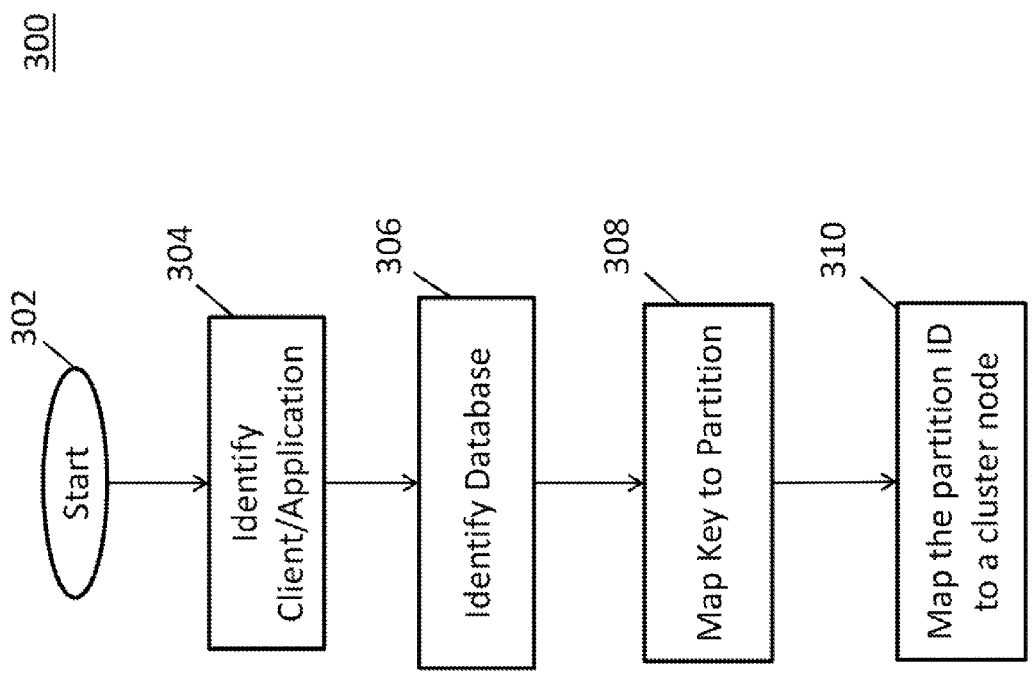
FIG. 3 is a diagram of a process for mapping a key to a partition in accordance with some embodiments.

DMC 202 can also be used to make routing decisions in accordance with some embodiments. Any suitable mechanism for making routing decisions can be used in some embodiments. For example, in some embodiments, routing decisions can be made using process 300 illustrated in FIG. 3. As shown, after beginning at 302, process 300 can determine the identity of a client and/or application that issued a request for data at 304. In some embodiment, this determination can be based on data from a client authentication process. Next, at 306, process 300 can determine which database (or bucket) the client is attempting to access by looking at the destination port of the TCP connection from which the request has been received. Then, at 308, process 300 can map a key received with the request to a user database (or bucket) partition. For example, such a mapping can be performed by hashing the key against the database (or bucket) partition space to get a partition ID of the key, and then by performing a short lookup operation to map the partition ID to a server. Any suitable hash function, such as SHA1, CRC16, etc., can be used in some embodiments. Any suitable partition space, size, such as N=1024, can be used in some embodiments. Then, at 310, process 300 can map the partition ID to a cluster node.

In case there is a need to increase (or reduce) the partition space size (e.g., due to extensive memory usage or high traffic load), a consistent hashing algorithm can be used to rebalance the keys across the new partition space without scanning all of the objects from all servers.

Any suitable mechanism for identifying a server in a node can be used. For example, a server can be identified by a port number that is appended to an IP address of a node (e.g., NodeIP: ServerPort).

In accordance with some embodiments, DMC 202 can also be used to perform protocol translation. For example, in some embodiments, DMC 202 can perform a translation from a protocol used by clients/applications requesting data to a protocol used by servers 206. More particularly, for example, a client/application can request data using Memcached ASCII, Memcached binary, Redis old protocol, Redis unified protocol, and/or any other suitable protocol. Servers 206 can communicate using a Redis unified protocol modified to include extensions that allows the servers to support operations which are natively not supported by a Redis server (e.g., Memcached commands) without breaking the Redis unified protocol semantics. And DMC 202 can perform a translation between these protocols.

For example, in accordance with some embodiments, DMC 202 can perform translation between the Memcached protocol and a modified Redis unified protocol. In doing so, the following can be performed. First, a client may issue a Memcached cas command using the following format: cas <key> <flags> <exptime> <bytes> <cas unique> [noreply] \r\n. Note that cas is a check and set operation, which means "store this data but only if no one else has updated since I last fetched it." This command can then be translated to a new command, RCAS, using the following format: RCAS <key> <flags> F(<exptime>) <cas unique> <bytes/body>.

In doing so, the DMC can perform the following steps when translating a Memcached cas command received from the client to the new RCAS command. If a noreply argument is used by the client, the DMC does not forward this argument to the server. Instead the DMC remembers that the initial request included this option, and therefore will not transfer the Redis reply to the client. If Memcached expiration time (exptime) uses Unix time format, the DMC can translate the Unix time to offset in seconds from the current time. The DMC can then receive a response to the RCAS command as follows. A "+OK\r\n" response can be received, which indicates success. A "−NOT_STORED" response can be received, which indicates that the data was not stored, but not because of an error. A "−EXIST" response can be received, which indicates that the item trying to be stored with the RCAS command has been modified since it was last fetched. A "−NOT_FOUND\r\n" response can be received, which indicates that the item trying to be stored with a RCAS command did not exist or has been deleted. These received messages can then respectively be translated to "STORED\r\n", "NOT_STORED", "EXIST\r\n", and "NOT_FOUND" of the Memcached protocol.

DMC 202 can also perform load balancing in some embodiments to balance loads among a master server 206 (which can respond to read and write requests for data objects) for a database (or bucket) partition and one or more slave servers 206 (which can respond to read requests for data objects) for the same partition. For example, in some embodiments, the DMC for a partition that resides over multiple servers 206 (e.g., one master server and N (zero or more) slave servers), can redirect a request for a data object on that partition to a relevant least used server 206 based on shared usage statistics.

Figure 4:
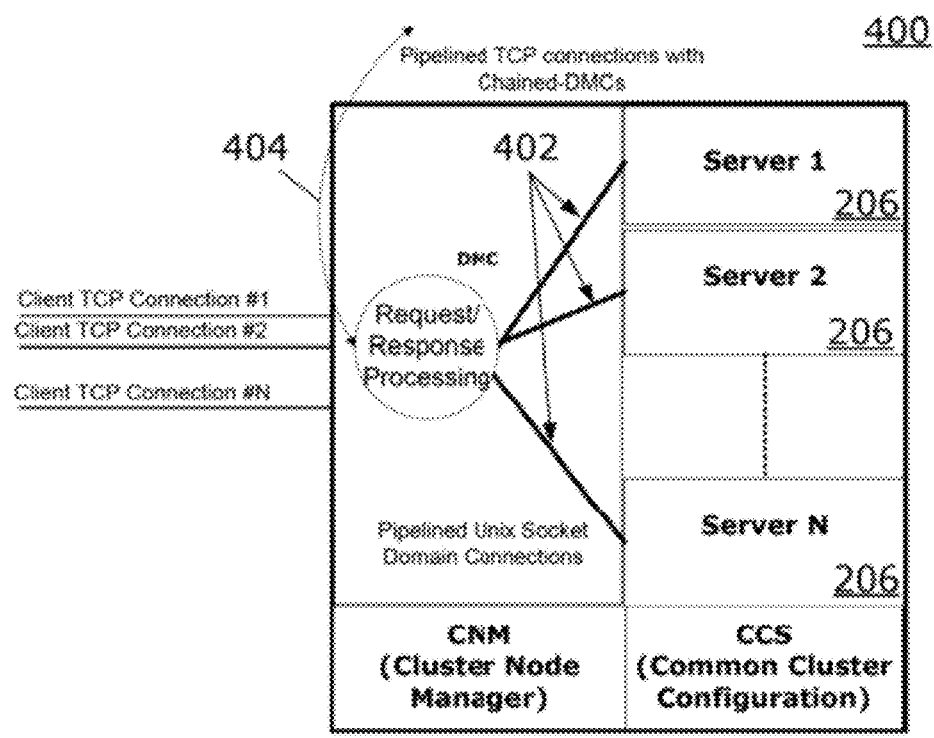
FIG. 4 is a diagram of a connection between a data management controller and servers and other data management controllers in accordance with some embodiments.

In some embodiments, DMC 202 can redirect requests to and responses from a node on which a data object is stored when a request for that data object is received at the wrong node. In some embodiments, this redirection of responses can occur via dedicated connections 404 to one or more other DMCs in other nodes as shown in FIG. 4.

To improve the performance of servers 206, DMC 202 can perform connection pooling in some embodiments. Any suitable technique for connection pooling can be used in some embodiments. For example, as shown in FIG. 4 in some embodiments, the DMC can maintain a number of connections 402 with each server 206 so that each addition or removal of a connection from a server will degrade its throughput and increase its latency. In some embodiments, connections 402 between a DMC 202 and servers 206 can be long-lived, persistent connections that reduce the overhead associated with connection setup and teardown between client and server.

To improve the performance of servers 206, DMC 202 can additionally or alternatively use Unix domain socket connections between the DMC and the servers in some embodiments. When the DMC and the server reside on the same physical/virtual machine, Unix domain socket connections can be used to eliminate the processing overhead associated with managing TCP connection between the DMC and the servers.

To improve the performance of servers 206, DMC 202 can additionally or alternatively perform request pipelining in some embodiments. Requests can be pipelined by the DMC by sending multiple requests to the same server before responses to the earlier of those requests are received from the server on requests that were previously sent on the same connection.

In some embodiments, the number of connections and the size of a pipeline between DMC 202 and each server 206 can additionally or alternatively be changed based on the average object size in the server. For example, in some embodiments, when the average object size in a server is less than 1 kB, the DMC may open fewer (or reduce the number of) persistent connections with the server and increase the pipeline size (i.e., the number of requests that can be sent to the server without waiting for its response). However, when the average file size is over 20 kB, for example, the DMC may increase the number of persistent connections with the server and reduce the pipeline size.

In some embodiments, the DMC can additionally or alternatively prioritize light processing requests over heavy processing requests coming from different client connections. Any suitable basis for selecting a processing request as being light or heavy can be used in some embodiments. For example, a Redis GET request can be considered to be a light request, where as a Redis ZRANGEBYSCORE request can be considered to be a heavy request.

In some embodiments, the DMC can additionally or alternatively send the same response to multiple requesters when a read request for a data object is received while another read request for the same data object has already been sent by the DMC to a server, but a corresponding response not received. In doing so, the DMC can queue one or more later requests until the response for the first request is received. The DMC can then send that response to the client that sent the first request and to all the clients with queued requests.

In some embodiments, the DMC can additionally or alternatively provide a cache for frequently requested data objects. In some embodiments, the frequently requested objects can be more frequently requested than the frequently requested objects similarly replicated across servers 206 as described below.

In accordance with some embodiments, cluster node manager (CNM) 204 can be used to perform node management functions and cluster management functions. For example, the cluster node manager can be used to monitor the status of each node, configure the node, control inter- and intra-node communications, elect nodes for aggregation and supervision functions, and provide a management interface for the cluster operation.

In accordance with some embodiments, CNM 204 as a node manager can monitor for failures and/or degraded status in other nodes and in servers of its own node. Any suitable mechanism can be used for determining that another node or server has failed or become degraded in some embodiments. For example, in some embodiments, periodic messages can be sent out by each server in a node to the CNM of the node. The CNM can detect a failure when a message is missing. As another example, in some embodiments, each CNM can send out a periodic message to CNM(s) in one or more other nodes. The CNM(s) in the one or more other nodes can detect a failure when this message is missing. As yet another example, each server can send out a memory fragmentation status message to the CNM in the same node to alert the CNM if its performance has become degraded. Any suitable action can be taken in response to a failure or degraded status. For example, in some embodiments, a CNM can cause a server or another node to restart its software upon a failure being detected, to perform a de-fragmentation process upon a degraded status being detected, etc. In some embodiments, when the fragmentation ratio crosses a pre-defined threshold, the following can be performed: (1) another server on the same node or on a different node can be started; (2) the fragmented server can be backed-up; (3) all clients can be switched to the new server; and (4) the fragmented server can be released.

In some embodiments, CNM 204 as a node manager can receive, process, and monitor local configuration data, and/or monitor and collect node statistics, such as DMC statistics and server statistics.

In some embodiments, CNM 204 as a node manager can translate server statistics to other non-relational database statistics. For example, when a Memcached user asks to get his/her Memcached statistics for the user's server 206 that is based on a Redis server, the request can be forwarded to the relevant node that contains the user's server 206 that holds the user dataset, and the CNM in that node can process this request and translate the Redis statistics to Memcached statistics.

In some embodiments, CNM 204 as a node manager can provide statistics information to other components upon request.

In some embodiments, CNM 204 as a node manager can monitor the DMC and server(s) for performance alerts. For example, the CNM as a node manager can monitor cases where the throughput or the latency of the node or the server crosses pre-defined thresholds.

In some embodiments, CNM 204 as a node manager can control the load of the replication processes across the servers which reside on the same node, and control the multi-cluster replication operation of the server(s) within a node.

In some embodiments, CNM 204 as a cluster manager can manage cluster configuration by communicating with another CNM designated as a Node Configuration Manager for allocating and releasing resources.

In some embodiments, CNM 204 as a cluster manager can rebalance the load of the nodes across a cluster.

In some embodiments, CNM 204 as a cluster manager can make auto-sharding (scaling-out) decisions when a specific database (or Bucket) has to be split over more than one server due to load or memory constraints. This can be accomplished in any suitable manner. For example, the CNM can instruct a server to send one or more user data set partitions to a new server, and then the CNM can instruction the DMC to redirect requests destined to this partition(s) to the new server. Similarly, in some embodiments, CNM 204 as a cluster manager can make auto-merging (scaling-in) decisions when a specific database (or Bucket) has to be merged from two or more servers to fewer servers due to reduced load or a reduction memory size. This can be accomplished in any suitable manner. For example, the CNM can instruct a server to send one or more user data set partitions to a target server that already manages a portion of the user data set, and then the CNM can instruction the DMC to redirect requests destined to this partition(s) to the target server.

In some embodiments, CNM 204 as a cluster manager can update the cluster DNS servers with any configuration change of the database (or Bucket). These updates can be used to ensure that only one protocol hop will be used between the clients and the cluster nodes in some embodiments.

In some embodiments, CNM 204 as a cluster manager can maintain a global configuration map that maps of all users datasets (e.g., databases or Buckets) with their partitions to cluster nodes and servers. In some embodiments, when the CNM receives a request to create a user dataset, or receives a request to increase the size of a user dataset, the CNM can perform an admission control process which will look for additional resources over existing nodes of a cluster or alternatively will add a new node to the cluster. In some embodiments, when the CNM receives a request to delete a user dataset, or receives a request to decrease the size of a user data set, the CNM can perform an admission control process which will release the resources.

In some embodiments, CNM 204 as a cluster manager can maintain a global rebalancing process in order to ensure that all resources of a cluster are spread equally across nodes.

In some embodiments, CNM 204 as a cluster manager can forward monitoring requests from the system manager to the proper CNM and aggregate statistics from multiple servers that serve the same database (or Bucket). Information about levels of utilization of the servers 206 can be exchanged between cluster node managers (CNM) 204 in different nodes.

In some embodiments, CNM 204 as a cluster manager, together with the relevant another CNM designated as a Node Replication Controller, can perform cross-clusters replication operations.

In some embodiments, DMC 202 and CNM 204, each of which is a control process, can be combined to form a combined control process.

In some embodiments, server(s) 206 can be used to provide in-memory non-relational database functionality and any other suitable server process(es). In some embodiments, the server(s) can be based on the open-source Redis server with enhanced functionality. In some embodiments, the server(s) can represent one of the following options: (1) a Memcached Bucket; (2) a partition of a Memcached Bucket; (3) a Redis database (DB); or (4) a partition of a Redis DB.

In some embodiments, each cluster's node manages N servers, and there can be any suitable number of servers, including zero, in some embodiments.

In some embodiments, in addition to functionality performed by a Redis server, server 206 can also support data operations which are not natively supported by a Redis server, such as cas and prepend commands and flag and cas arguments of Memcached. Commands and arguments which are not natively supported by the Redis server are transmitted to server 206 using the extension(s) of the modified Redis unified protocol, which extends the supported Redis command while preserving Redis unified protocol semantics. Server 206 supports these extensions by adding new elements to the object key data structure and by implementing the command logic behind the new commands. Examples for the new elements that are added to the Redis Object Key Data Structure are:

flags field: to support the Memcached flag functionality; and cas field: to support the Memcached cas functionality.

In some embodiments, in addition to functionality performed by a Redis server, the server can also perform real-time (or near real-time) class-based compression. In order to perform this compression, in some embodiments, a set of global dictionaries for finding duplicated strings across multiple objects can be provided. These dictionaries can treat all the non-relational objects that belong to a certain class as a one big object. As a result, an object can be compressed based on many data patterns which appeared in objects previously processed by the compression process.

Any suitable compression dictionaries can be used in some embodiments. For example, the compression dictionaries can be a LZW/LZ78dictionary, a LZP dictionary, or any other suitable compression dictionary.

These dictionaries can be saved globally and can be not attached to each object, which provides additional reduction in the size of each compressed object, in some embodiments.

In some embodiments, a classification mechanism can be used to classify objects according to data patterns that were found in the objects and can provide a dedicated global dictionary per object class. This mechanism can find new classes of objects and merge classes of objects. As a result, the total size of each compression dictionary can be reduced, which contributes to additional enhancement in the compression ratio.

In some embodiments, in addition to functionality performed by a Redis server, a real-time (or near real-time) compaction mechanism for cached objects can be provided. In some embodiments, this compaction mechanism can delete cached objects immediately (or a soon after) after they have been expired.

In some embodiments, in addition to functionality performed by a Redis server, a mechanism for storing frequently used objects in a partition that is replicated across multiple nodes can be provided. In this way, multiple nodes can each serve the frequently used objects simultaneously thus improving performance. In some embodiments, these frequently used objects can always be stored in an uncompressed format.

In accordance with some embodiments, CCS 208 is an internal cluster repository service (based on the Redis architecture). In some embodiments, this service can include a per-node and a per-cluster configuration, statistics, and alert information. All the nodes in a cluster can be synchronized with the per-cluster configuration. The DMC and CNM can be registered to the CCS to receive configuration change events which are relevant to their operations.

As shown in FIG. 1, in accordance with some embodiments, each cluster can include one or more Backup Nodes 112.

In accordance with some embodiments, the Backup Node can request dataset snapshots from each server 206 in the cluster and write the snapshots to a persistent storage media of the Backup Node, such as a hard disk drive (HDD), solid state drive (SSD), Amazon EC2 Elastic Buffer Storage (EBS). In some embodiments, these snapshots can be written in a compressed format.

In accordance with some embodiments, the Backup Node can launch a slave server for every server that runs in the nodes of the cluster. These slave servers can receive dataset updates from the corresponding master server. These updates can be written to a persistent storage device, such as a direct attached storage or non-direct attached storage, e.g. Amazon EC2 EBS service.

In some embodiments, the Backup Node may store large portion of its dataset over persistence storage and only a fraction of its dataset on in-memory RAM.

In some embodiments, the cluster architecture described herein can be provided as a service. A user of this service can be registered through the service manager (SM), which communicates with a CNM designated as a Cluster Orchestrator to allocate user resources in the cluster. In some embodiments, the SM may allocate resources across multiple clusters.

In some embodiments, a user resource can be a Memcached Bucket, a Redis database (DB), or any other suitable non-relational database. Each Bucket/DB can be hosted over one or more servers 206, depending on the transaction load imposed and the memory size of its dataset. In some embodiments, each Bucket/DB can be composed of multiple partitions (e.g., 1024 or any other suitable number). In some embodiments, keys can be equally spread over the different partitions by applying a hash function technique. Partition space may scaled dynamically (in or out) if necessary, using a consistent hashing algorithm.

In some embodiments, a partition in a cluster can be hosted by one master server 206, and by zero or more slave servers 206. Master servers can serve both read and write requests, and slave servers can only serve read requests, in some embodiments.

When a Bucket/DB is created, the user can be provided with a list of DNS addresses to be used for accessing his/her Bucket/DB in some embodiments. The user then needs to configure its application servers to use these addresses. This list can include DNS addresses for both master and slave servers 206 that hold the Bucket/DB: Multiple DNS addresses may point to the same server 206.

Application requests may be sent directly to the node where the key is hosted, or may be redirected to that node by another node (through the DMC).

Figure 5:
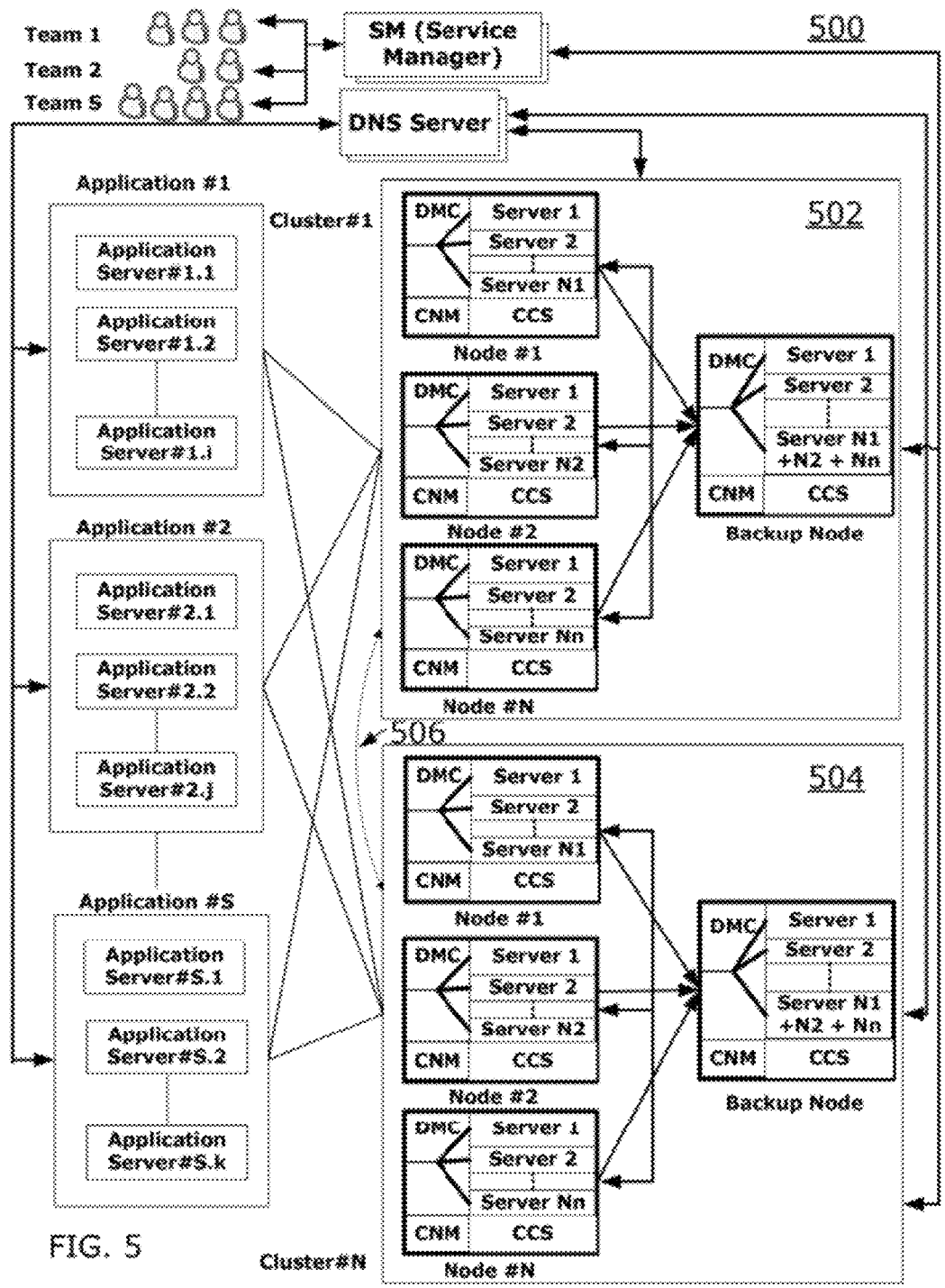
FIG. 5 is a diagram of a multi-cluster, multi-region architecture in accordance with some embodiments.

In some embodiments, a multi-cluster architecture can be implemented. Where the multi-cluster architecture can be implemented over: a single zone belonging to a region of a single cloud vendor; a multi-zone belonging to a region of a single cloud vendor; a multi-region of a single cloud vendor; and a multi-cloud, as illustrated in FIG. 5. As shown, each cluster 502, 504 in this architecture can reside in a different geographical region of a cloud or in a different zone where each region includes multiple zones (like the Amazon Elastic Cloud (EC2) architecture) or in different clouds (like the Amazon cloud and the RackSpace cloud).

In some embodiments, when a multi-cluster configuration is enabled, data can be synchronized across dispersed geographical regions via a dedicated channel 506 shown in FIG. 5. This can be performed as follows. First, when a Bucket/DB is created with a multi-region property, the Cluster Orchestrator (a CNM) and the Cluster Replication Controller (also a CNM) of each cluster can allocate the nodes and servers 206 that will take part in this synchronization process. Next, one or more long-lived persistent TCP connections can be built between the two the DMCs of the nodes that are involved in the multi-cluster synchronization process (the DMC channel), and the two DMCs can synchronize their internal timers. The two DMCs can also compress the data across the transmission channel so that the number of bytes transmitted across regions and the latency associated with this transmission can be reduced. Each DMC can maintain a set of dictionaries for its egress transmission and its ingress reception. Whenever a change in one of the egress compression dictionaries occurs, the DMC can attach the modified relevant entries to the message it sends to its peer-DMC. The receiver DMC can check whether new dictionary entries are attached to the messages it receives and add them to the relevant ingress compression dictionary. For multi-zone synchronization, the DMCs can use a time-based versioning method to determine which value of the object was the last to be written. Alternatively, in some embodiments, each DMC can determine what was seen in the Bucket/DB before the write operation took place and use the more-updated data.

For subsequent write requests in a multi-zone synchronization configuration, a conservative acknowledgement mechanism in which acknowledgment message in response to the write request is sent to a user application only after validating that the write request was properly synchronized by the remote cluster.

Figure 6:
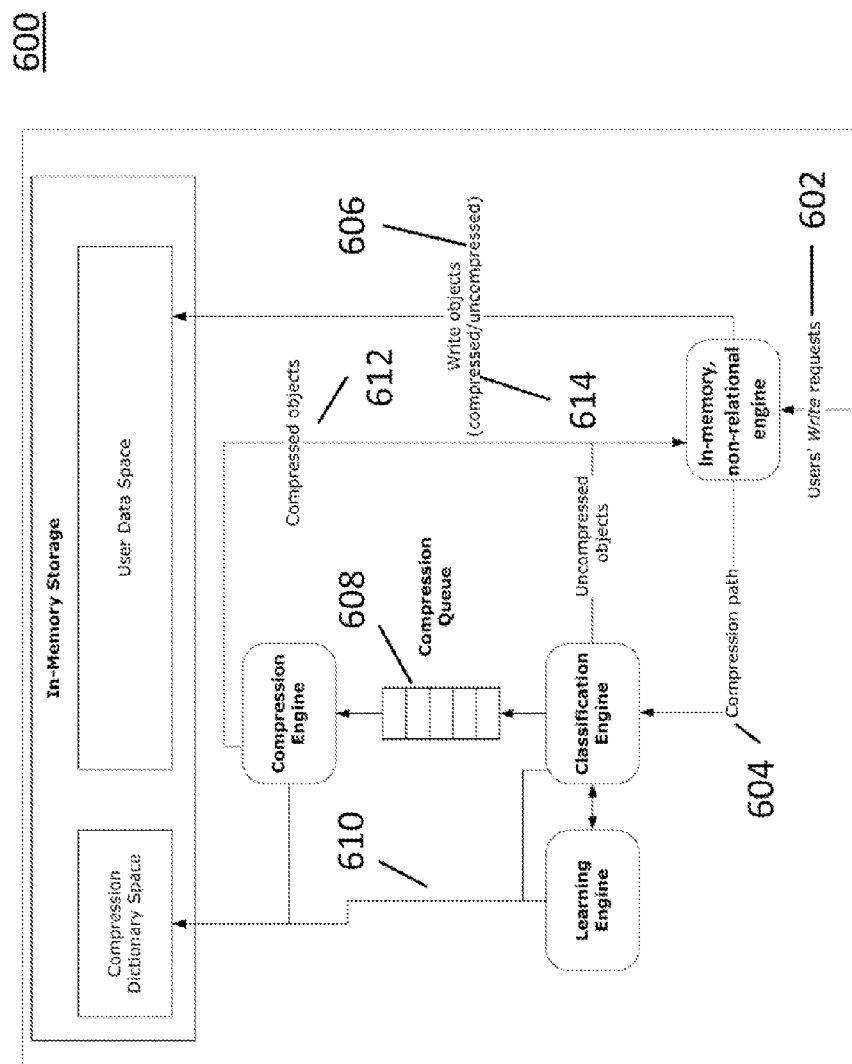
FIG. 6 is a diagram of a write process in accordance with some embodiments.

In some embodiments, compression can be performed on data during write requests in order to improve memory usage. Any suitable compression technique can be used. For example, in some embodiments, a compression architecture 600 as illustrated in FIG. 6 can be used.

Upon receiving a write request from a user at 602, an in-memory non-relational engine in server 206 can analyze the request type and forwards the write request to a classification engine at 604, while simultaneously writing the object in an uncompressed format to the user data space of the in-memory storage at 606. In some embodiments, the classification engine can then analyze the object key and value and accordingly classify the object to a compression dictionary. At the end of the classification process, the object is forwarded to a compression engine through a compression queue at 608, with an indication flag that tells the compression engine which dictionary shall be used to compress the object. The object can also be forwarded to a learning engine, if the learning engine is in its training iteration stage (as described below). If the object's value cannot be compressed, then the compression process can stop.

In some embodiments, the learning engine can create compression dictionaries and the associated classification rules according to the user's dataset at 610. After each learning iteration, the learning engine may: (1) create new compression dictionaries and classification rules; (2) update the classification rules of existing compression dictionaries; and (3) split existing compression dictionary into multiple dictionaries and attach compression rules to each dictionary.

In some embodiments, the compression queue can be used protect the compression engine from being flooded by compression requests.

In some embodiments, the compression engine compresses the object data with the selected dictionary and forwards the compressed object back to the in-memory non-relational engine at 612.

In some embodiments, upon receiving requests from the compression engine to write a compressed object, at 614, the in-memory non-relational engine overwrites the existing uncompressed object's value with the new value, and release the buffers associated with the uncompressed objects.

In some embodiments, to avoid a situation where an object's value was changed before the compressed object corresponding to the object's value arrived to the in-memory non-relational engine, a running counter for every object can be maintained. This running counter can be incremented by one for every change in the object's value. This counter can then be recorded when the compression process starts. If, at the end of the compression process and before that object is written back to the memory in a compressed format, it is found that the running counter is different from the recorded value, the compressed object is deleted. Otherwise, the uncompressed object is replaced with the compressed object when the running counter and the recorded value are equal.

The classification engine can determine which dictionary should be used for compressing the write object (or if it should not be compressed at all) according to classification rules and forwards the object to the compression engine. This decision can be based on pre-defined regular expression rules as well as on new learned rules, received from the learning engine. Examples of classification rules are presented in the table of FIG. 7. At the end of the classification process, the object can be forwarded to the compression engine through the compression queue, with an indication that tells the compression engine which dictionary shall be used to compress the object.

In some embodiments, the learning engine finds a compression dictionary for an object and finds regular expression rules for classifying the object to its compression dictionary.

In some embodiments, the learning engine can find a compression dictionary as follows. First, the learning engine records N objects' values={$O_1, O_2, \ldots O_N$}. This recording step is the learning engine's training iteration stage. For each $O_i \in \{O_1, O_2, \ldots O_N\}$, the learning engine next builds a set of all the strings patterns with a length equal to or smaller than L that are included in $O_i$, i.e., {$SO_{i1}, SO_{i2}, \ldots, SO_{im}$}. For each pair of objects {$Q_i, Q_j$} $\in$ {$O_1, O_2, \ldots O_N$} and their related sets of string patterns {$SO_{i1}, SO_{i2}, \ldots, SO_{im}$}, {$SO_{j1}, SO_{j2}, \ldots, SO_{jm1}$}, the learning engine can then apply the Smith Waterman algorithm (or any other suitable algorithm) to match strings patterns. If the number of matched patterns $M_{ij}$ is greater than a defined threshold $T_{objects}$, the objects $Q_i$, $Q_j$ can be compressed using the same compression dictionary. Next, a set of classes of objects can be built {$C_1, C_2, \ldots, C_K$}. The learning engine can then look for a match between existing dictionaries {$D_1, D_2, \ldots, D_p$} and the new set of object classes {$C_1, C_2, \ldots, C_K$}. This can be done as follows. First, for each new class $C_i$, the learning engine arbitrarily selects an object $O_j$ and applies the Smith Waterman algorithm (or any other suitable algorithm for matching) against each of the strings patterns belongs to dictionary $D_k$. If the number of patterns matched $M_{ik}$ is greater than a defined threshold $T_{dictionary}$, the learning engine can classify all the objects $O_j \in C_i$ to dictionary $D_k$. Otherwise, a new dictionary can be created for all the objects $O_j \in C_i$.

In some embodiments, the learning engine can find regular expression rules for classifying an object as follows. First, the learning engine applies a text motif identification process on each recorded object so that the text motif identification process is applied to all or the first N bytes of the object value. The text motif identification process can include comparing text included in all of, or in the first N bytes of, each object value to a predefined set that includes multiple indicative text sequences.

Indicative text sequences are imbalanced motifs that can be indicative of an optimal (or best) dictionary. For example, consider a set of text sequences: $S_1 \ldots S_n$ and assume that these text sequences are ordered according to their correspondence to a certain compression dictionary. For a shorter text element (motif) M, it is said that M is rank imbalanced if it appears more in high ranking sequences $S_i$ than in low ranking sequences $S_j$. The representation M $\in S_i$ indicates that the short text M appears in the text $S_i$.

Figure 8:
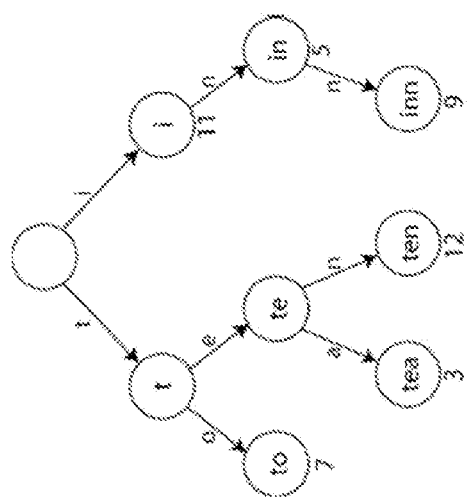
FIG. 8 is a diagram of a Trie Tree in accordance with some embodiments.

Next, the learning engine can extract all substrings of the objects to a Trie tree. FIG. 8 illustrates an example of a Trie Tree data structure that stores the strings "to", "tea", "ten", "i", "in", and "inn" in accordance with some embodiments. Each node in the Trie Tree represents a text element (motif) M. For each node $N_i$ in the Trie Tree that represents a text element M, the learning engine can maintain an occurrence vector, V, the components of which follow the following rule: $V_i=1$ if M or any $S_i$ which M $\in S_i$ uses dictionary $D_i$ for its compression. Next, the learning engine can calculate a p-value for each node's occurrence vector V, as described below.

The text motif identification process can include processing hyper-geometric distributions. For example, consider N=B+W elements wherein B of these elements have some property herein denoted as "black" and W of these elements have another property herein denoted as "white". Assuming that n elements are sampled, without replacement, the probability of seeing exactly b black elements is:

$$H(N, B, n, b) = \frac{\binom{B}{b}\binom{N-B}{n-b}}{\binom{N}{n}}$$

The corresponding tail probability, or p-value is:

$$HGT(N, B, n, b) = \left[\frac{1}{\binom{N}{n}}\right] \sum_{k=b}^{n} \binom{B}{k}\binom{N-B}{n-k}$$

When considering a ranked list of text sequences as above and given a single query motif, m, the learning engine can use the minimum hyper-geometric (mHG) score to assess the significance of a tested motif for finding a dictionary. The text motif identification process can be responsive to a maximal match inspection threshold (denoted as D), which represents a limit as to how far down in the texts motifs lookup table a match should be looked for.

For a binary occurrence vector V with N entries out of which B are "1", the Learning Engine defines: mHG(v)= min1≤n≤DHGT(N,B,n,b(n)); where b(n) indicates the number of "1's" in V(1 . . . n).

The learning engine can then use mHG(v) to assess the significance of the tested motif for finding a compression dictionary. Small values of mHG(v) can indicate that the tested motif is strongly indicative of finding a compression dictionary.

If, for node $N_i$, p-value<p-value-threshold, the text element M represented by $N_i$ is a potential classification rule for the data class represented by dictionary $D_i$.

Figure 9:
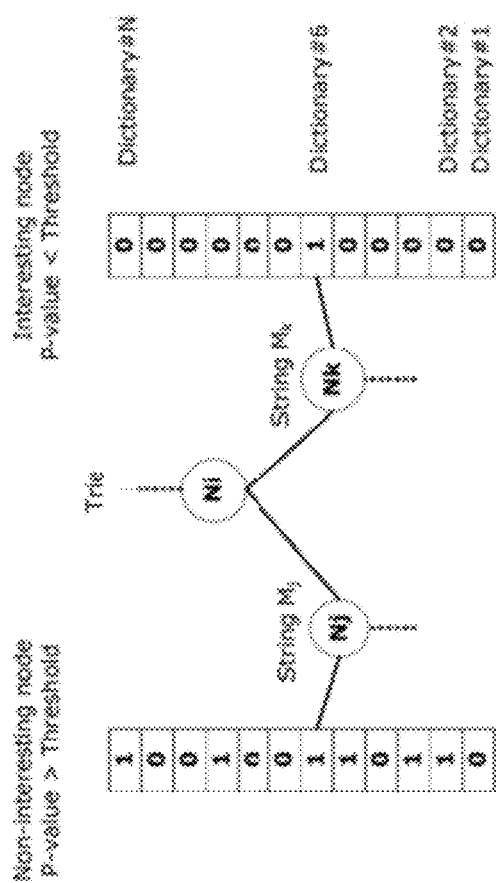
FIG. 9 is a diagram of another Trie Tree in accordance with some embodiments.

FIG. 9 illustrates an example of a Trie Tree data-structure in which each node has an occurrence vector corresponding to the compression dictionaries. If M represents the string of node $N_i$ and all the stings $S_i$ whereby $M \in S_i$ are compressed by the same dictionary, then M is a potential classification rule for the data class represented by this dictionary.

In some embodiments, the mechanisms for selecting a compression dictionary for an object and for adding classification rules to dictionaries can be applied to both an object's value and an objects' keys.

In some embodiments, the compression engine can use duplicate string elimination for strings B bytes or less long. Any suitable duplicate string elimination technique can be used in some embodiments. For example, in some embodiments, whenever the compression engine finds a match between an object string and a dictionary entry, the string is replaced with the entry index or, in case of the LZP dictionary, with the string index plus string length that indicates the length of the match.

In some embodiments, the size of the dictionary of each data-class can be limited in-order to make the compression effective as possible. For example, if the size of a dictionary reaches a certain limit, the following may be performed: (1) divide the data class into multiple sub-classes; (2) build another dictionary for the same data class, and populate it with the most frequently accessed patterns of the data-class; and/or (3) not allow the insertion of additional rows to the dictionary.

In some embodiments, the compression engine can also eliminate common duplicate strings over B bytes long. Any suitable technique can be used in some embodiments. For example, in some embodiments, the compression engine can use a modified version of the BMDiff algorithm per data class, which ignores duplicate strings of length less than B and which discovers all repeated strings with length of at least 2B-1. Strings with lengths between B and 2B-1 may be processed in the same way as strings of length less than B or as strings with lengths greater than 2B-1.

In some embodiments, the compression engine enhances the BMDiff operation by: applying it only to certain classes of data with a high probability of including long common strings, e.g., objects with values that include software code; and when being implemented over a certain data class, it uses a global dictionary for all objects of the data class and therefore long common string across different objects can be found.

In some embodiments, when eliminating common strings over a certain length, this mechanism precedes the process for eliminating duplicate strings under a certain length in the compression process, and, when used for decompression process, this mechanism follows the process for eliminating duplicate strings under a certain length.

In some embodiments, the compression engine can also provide a bit reduction process. The principle of bit reduction is that frequently used characters/patterns are represented by fewer bits, and not-so-often used characters/patterns are represented by more bits, resulting in fewer bits used in total. Any suitable bit reduction process can be used in some embodiments. For example, a bit reduction process based on entropy encoding, such as Huffman coding, Arithmetic coding, or any other suitable encoding technique, can be used.

In some embodiments, a global bit reduction dictionary can be maintained for each data-class. Each bit reduction dictionary can be built with default probabilities for each character/pattern belonging to a data class, based on the entropy of the class. For example, if a class represents web pages, the pattern "www" will appear frequently and is therefore represented by fewer bits. Then, at any suitable frequency, or continuously, the frequency of appearance of each character and pattern in a given class can be measured, and a measured bit reduction dictionary can be built based on these measurements. The measured bit reduction dictionary of each class can then be compared to the active bit reduction dictionary of the class. If the gap between the measured bit reduction dictionary and the active bit reduction dictionary of a class is more than a pre-defined threshold (i.e., the number of characters and patterns whose frequency change is higher than a threshold), a dictionary switchover can be performed, in which the active bit reduction dictionary is stored and the measured bit reduction dictionary becomes the active dictionary for the data class. To allow decompression of objects that were compressed prior to the bit reduction dictionaries' switchover, a pointer in each object data-structure can be maintained to the bit reduction dictionary it used. In some embodiments, this bit reduction process can be performed after the process for eliminating duplicate strings under a certain length is completed on the object message.

In some embodiments, when the bit reduction process is implemented, it can be implemented as the last compression algorithm in the compression process chain and the first decompression algorithm in the decompression process chain.

Figure 10:
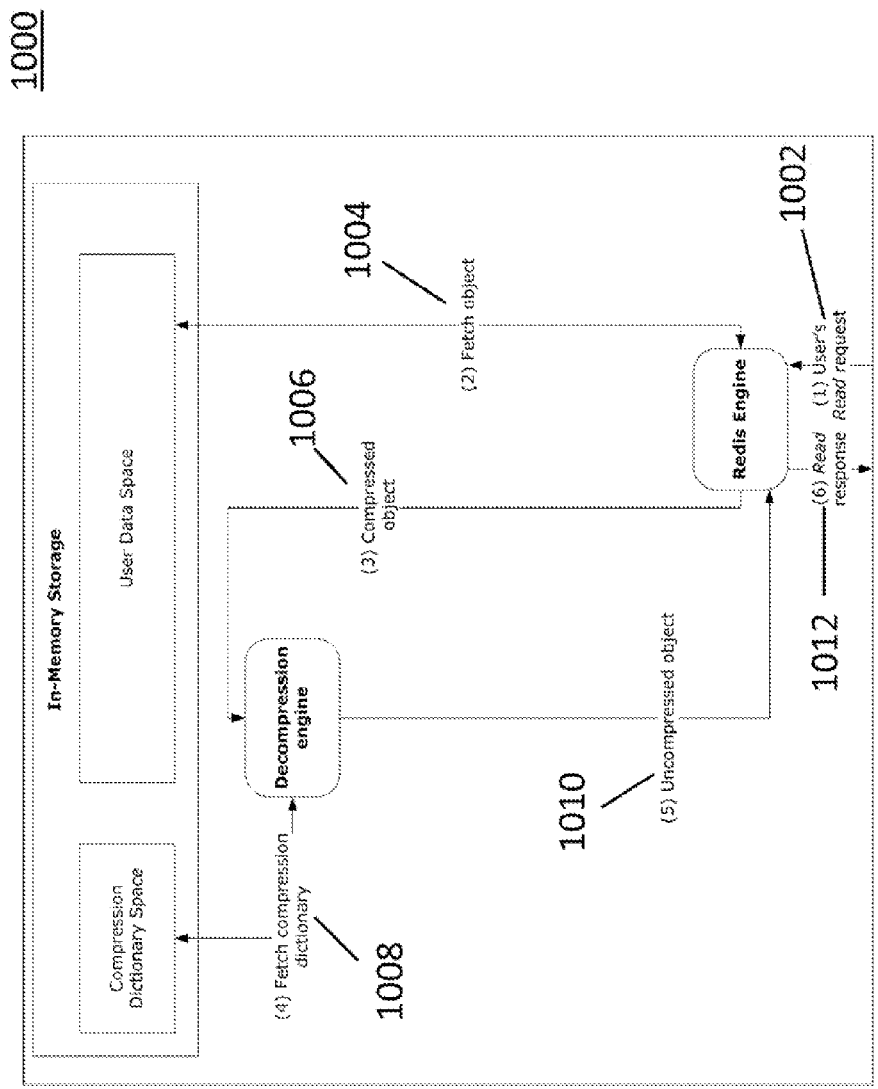
FIG. 10 is a diagram of a read process in accordance with some embodiments.

Turning to FIG. 10, an example of a decompression mechanism 1000 that can be used in accordance with some embodiments is shown. As illustrated, at 1002, a Read request for an object from a user (or user's application) can be received. Next, the object can be fetched from memory at 1004. If the object is uncompressed, the Read response to the user or user application can be sent through the other cluster node components, such as the DMC, at 1012. If the object is compressed, the compressed object can be sent to the decompression engine with a pointer to the compression dictionary used to compress the object at 1006. The decompression engine can then fetch the compression dictionary from memory at 1008 and decompress the object. The decompression engine can then send the uncompressed object to the in-memory, non-relational engine at 1010. Finally, at 1012, the Read response can be sent to the user or user application through the other cluster node components, e.g. the DMC.

In some embodiments, the object can be decompressed in a chunk by chunk manner, where each chunk of data is limited to the size of the MTU (Maximum Transfer Unit).

In some embodiments, four processes for a real-time (or near real-time) compaction mechanism can be provided. This mechanism can apply when the in-memory non-relational database is configured to act as a cache. These processes can include: actively deleting expired objects; actively deleting older versions when a new version of the same object is added; enforcing an access-time-based eviction policy, in which objects that were not accessed by the application during a pre-defined period of time are automatically deleted from the in-memory non-relational server; and/or adding a frequency-time-weighted-use (FTWU) eviction policy (as described below).

In some embodiments, active deletion of expired objects can be performed in any suitable manner. For example, in some embodiments, active deletion of expired objects can be performed as follows. First, every new object written with a non-zero expiry parameter can be added to the compaction expiry heap and sorted by its expiry time. Every S seconds, the compaction engine can compare the current time with the expiry time of objects in the heap. The compaction engine can then send Redis "Delete" messages to all objects in the expiry heap with expiry time equal or smaller than the current time.

In some embodiments, when an application uses an "expiry by seconds" mechanism in which the expiry is represented by seconds from the time the object has been written to the in-memory non-relational database, the compaction engine can normalize this value to "expiry by time" by adding the expiry seconds to the time the object was set.

In some embodiments, active deletion of older versions of objects can be performed in any suitable manner. For example, in some embodiments, active deletion of older versions of objects can be performed as follows. First, the application owner can configure the compaction process with the application object versioning scheme. This can include a description of how to find an object version in the key, and which method is used for versioning an object. The configuration process can use Regular Expression (RegEX) syntax or any other suitable mechanism. Next, a change to the in-memory non-relational database hash function can be applied, in which the version of an object is masked out from the key when the hash function is calculated. This assures that multiple versions of the same key will always result in the same hash entry. When the in-memory non-relational database "write" command is received for an object, a check can be made to determine whether an older version of this object exists in the hash entry, and if yes, the older version can be deleted after the new version is stored, unless the older version is currently being accessed. In such case, the older version can be deleted after this access is completed In some embodiments, enforcement of an access-time-based eviction policy can be performed in any suitable manner. In some embodiments, the mechanism for enforcement of an access-time-based eviction policy can allow an application owner to configure a global or per object time-based eviction policy. For example, in some embodiments, enforcement of an access-time-based eviction policy can be performed as follows. First, the application owner can configure the compaction process with relevant access time-based eviction policy, i.e., global or per-object, and the desired expiry time (which can include "no expiry" in some embodiments). Next, a mechanism that counts the elapsed time since each object was last accessed can be maintained. If this time is above the predefined object access expiry time, the in-memory non-relational engine can be instructed to delete the object.

In some embodiments, this process for enforcement of an access-time-based eviction policy can be totally orthogonal to the regular expiry mechanism.

In some embodiments, a frequency-time-weighted-use (FTWU) eviction policy can be performed in any suitable manner. A FTWU eviction policy can attempt to make sure that objects with high hit rates will not be evicted just because they were not recently requested. For example, in some embodiments, a frequency-time-weighted-use (FTWU) eviction policy can be performed as follows. The Compaction Engine can constantly maintain an object-eviction-weight heap for all objects, sorted by object eviction weight such that the next eviction candidate is at the top of the heap. When the capacity limit is reached, the next eviction candidate is deleted from the in-memory non-relational database. The object eviction weight can be calculated as follows:

$$\text{Object eviction weight} = 1/\{F \times (LU/TH)\}$$

where:
  LU—seconds from last time the object was requested
  TH—total hits during a pre-defined period for eviction weight calculations
  F—a weight factor:
    1—the least-used and total-hits criteria are equally weighted (this is the default setting);
    <1—the total-hits criterion is weighted more than least-used criterion; and
    >1—the least-used criterion is weighted more than total-hits criterion.

In accordance with some embodiments, any one or more node, any one or more cluster, the service manager, and the DNS can be implemented in one or more general or special purpose devices, such as a general purpose computer, a special purpose computer, a client, a server, etc. Any of these general or special purpose devices can include any suitable components such as one or more hardware processor (each of which can be a microprocessor, digital signal processor, a controller, etc.), memory, communication interfaces, display controllers, input devices, etc. Any one or more of the connections between different components herein can be formed from any suitable communication link or combination of communication links. For example, the communication links can include the Internet, a local area network, a wide area network, a telephone network, a satellite network, a cable network, etc.

In some embodiments, any suitable computer readable media can be used for storing instructions for performing the processes described herein. For example, in some embodiments, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as flash memory, electrically programmable read only memory (EPROM), electrically erasable programmable read only memory (EEPROM), etc.), any suitable media that is not fleeting or devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or any suitable intangible media.

Although the invention has been described and illustrated in the foregoing illustrative embodiments, it is understood that the present disclosure has been made only by way of example, and that numerous changes in the details of implementation of the invention can be made without departing from the spirit and scope of the invention, which is only limited by the claims which follow. Features of the disclosed embodiments can be combined and rearranged in various ways.

What is claimed is:

1. A method for compressing objects, comprising:
  receiving a request to write a first object including a first key and a first value, wherein the first object is of a given type;
  receiving a request to write a second object including a second key and a second value, wherein the second object is of the given type;

classifying the first object to a compression dictionary according to at least one rule based on a value of the first object and/or the key of the first object;

classifying the second object to the compression dictionary according to at least one rule based on a value of the second object and/or the key of the second object; and compressing the first object and the second object based on the compression dictionary;

identifying first matching patterns in a pair of objects;

determining if the number of first matching patterns exceeds a first threshold;

when the number of first matching patterns is determined to exceed the first threshold, selecting an object from the pair of objects and identifying second matching patterns in the selected object and the compression dictionary;

determining if the number of second matching patterns exceeds a second threshold; and when the number of second matching patterns is determined to exceed the second threshold, assigning the pair of objects to the compression dictionary.

2. The method of claim 1, further comprising automatically identifying classification rules for classifying objects.

3. The method of claim 1, further comprising writing the first object to an in-memory, non-relational data store as an uncompressed object before the first object is compressed, and overwriting the uncompressed object with a compressed form of the first objected object when the first object is compressed.

4. The method of claim 3, further comprising determining when multiple uncompressed versions of an object have been written to the in-memory, non-relational data store before the compressed form of a first of the versions has been formed, and preventing the compressed form from overwriting a subsequent version of the object written to the in-memory, non-relational data store.

5. The method of claim 1, further comprising removing an object from an in-memory, non-relational storage if store when it has been expired or based on total hits on the object during a predefined period and an amount of time since the object was last requested.

6. A non-transitory computer-readable medium containing computer-executable instructions that, when executed by a processor, cause the processor to perform a method for compressing objects, the method comprising:

receiving a request to write a first object including a first key and a first value, wherein the first object is of a given type;

receiving a request to write a second object including a second key and a second value, wherein the second object is of the given type;

classifying the first object to a compression dictionary according to at least one rule based on a value of the first object and/or the key of the first object;

classifying the second object to the compression dictionary according to at least one rule based on a value of the second object and/or the key of the second object; and compressing the first object and the second object based on the compression dictionary;

identifying first matching patterns in a pair of objects;

determining if the number of first matching patterns exceeds a first threshold;

when the number of first matching patterns is determined to exceed the first threshold, selecting an object from the pair of objects and identifying second matching patterns in the selected object and the compression dictionary;

determining if the number of second matching patterns exceeds a second threshold; and when the number of second matching patterns is determined to exceed the second threshold, assigning the pair of objects to the compression dictionary.

7. The non-transitory medium of claim 6, the method further comprising automatically identifying classification rules for classifying objects.

8. The non-transitory medium of claim 6, the method further comprising writing the first object to an in-memory, non-relational data store as an uncompressed object before the first object is compressed, and overwriting the uncompressed object with a compressed form of the first objected object when the first object is compressed.

9. The non-transitory medium of claim 8, the method further comprising determining when multiple uncompressed versions of an object have been written to the in-memory, non-relational data store before the compressed form of a first of the versions has been formed, and preventing the compressed form from overwriting a subsequent version of the object written to the in-memory, non-relational data store.

10. The non-transitory medium of claim 6, the method further comprising removing an object from an in-memory, non-relational storage if store when it has been expired or based on total hits on the object during a predefined period and an amount of time since the object was last requested.

11. A system for compressing objects, comprising:

at least one hardware processor that:

receives a request to write a first object including a first key and a first value, wherein the first object is of a given type;

receives a request to write a second object including a second key and a second value, wherein the second object is of the given type;

classifies the first object to a compression dictionary according to at least one rule based on a value of the first object and/or the key of the first object;

classifies the second object to the compression dictionary according to at least one rule based on a value of the second object and/or the key of the second object; and compresses the first object and the second object based on the compression dictionary;

identifies first matching patterns in a pair of objects;

determines if the number of first matching patterns exceeds a first threshold;

when the number of first matching patterns is determined to exceed the first threshold, selects an object from the pair of objects and identifying second matching patterns in the selected object and the compression dictionary;

determines if the number of second matching patterns exceeds a second threshold; and when the number of second matching patterns is determined to exceed the second threshold, assigns the pair of objects to the compression dictionary.

12. The system of claim 11, wherein the at least one hardware processor also automatically identifies classification rules for classifying objects.

13. The system of claim 11, wherein the at least one hardware processor also writes the first object to an in-memory, non-relational data store as an uncompressed object before the first object is compressed, and overwrites the uncompressed object with a compressed form of the first object when the first object is compressed.

14. The system of claim 13, wherein the at least one hardware processor also determines when multiple uncompressed versions of an object have been written to the in-memory, non-relational data store before the compressed form of a first of the versions has been formed, and prevents the compressed form from overwriting a subsequent version of the object written to the in-memory, non-relational data store.

15. The system of claim 11, wherein the at least one hardware processor also removes an object from an in-memory, non-relational store when it has been expired or based on total hits on the object during a predefined period and an amount of time since the object was last requested.

* * * * *